United States Patent [19]

Ko et al.

[11] Patent Number: 5,802,270
[45] Date of Patent: Sep. 1, 1998

[54] INTEGRATED CIRCUIT HAVING AN EMBEDDED DIGITAL SIGNAL PROCESSOR AND EXTERNALLY TESTABLE SIGNAL PATHS

[75] Inventors: Uming U-Ming Ko, Plano; Bernhard Hans Andresen, Dallas; Glen Roy Balko, Richardson; Stanley Clifford Keeney, Dallas; Joe Frank Sexton, Houston, all of Tex.

[73] Assignee: Texas Instruments Incorporated

[21] Appl. No.: 818,618

[22] Filed: Mar. 14, 1997

Related U.S. Application Data

[63] Continuation of Ser. No. 957,754, Oct. 7, 1992, abandoned, which is a continuation of Ser. No. 410,443, Sep. 21, 1989.

[51] Int. Cl.$^6$ .................................................. G06F 11/267
[52] U.S. Cl. .................... 395/183.03; 395/183.06; 395/800.38; 395/800.39; 371/22.1; 371/22.6
[58] Field of Search .................... 395/183.03, 183.06, 395/800.38, 800.39; 371/22.1, 22.6

[56] References Cited

U.S. PATENT DOCUMENTS

| | | | |
|---|---|---|---|
| 4,482,953 | 11/1984 | Burke | 395/183.03 |
| 4,507,727 | 3/1985 | Magar | 395/800.33 |
| 4,514,805 | 4/1985 | McDonough et al. | 395/734 |
| 4,677,586 | 6/1987 | Magar et al. | 395/183.03 |
| 4,710,931 | 12/1987 | Bellay et al. | 371/22.35 |
| 4,713,750 | 12/1987 | Damouny et al. | 395/800.32 |
| 4,727,549 | 2/1988 | Tulpule et al. | 395/185.08 |
| 4,802,163 | 1/1989 | Hirabayashi | 371/22.31 |
| 4,821,269 | 4/1989 | Jackson et al. | 371/22.1 |
| 4,860,290 | 8/1989 | Daniels et al. | 371/22.31 |
| 4,905,240 | 2/1990 | Kimoto | 371/22.1 |
| 4,910,669 | 3/1990 | Garin et al. | 395/800.17 |
| 4,918,379 | 4/1990 | Jongepier | 371/25.1 |
| 4,926,355 | 5/1990 | Boreland | 395/800.36 |
| 4,965,511 | 10/1990 | Nishimura et al. | 324/73.1 |
| 4,967,387 | 10/1990 | Shibasaki et al. | 371/22.6 |
| 4,989,208 | 1/1991 | Akao et al. | 395/183.07 |
| 5,005,172 | 4/1991 | Kawamoto | 395/183.07 |
| 5,005,173 | 4/1991 | Martin | 371/22.6 |
| 5,032,783 | 7/1991 | Hwang et al. | 371/22.31 |

OTHER PUBLICATIONS

Weste et al., *Principles of CMOS VLSI Design*, Addison-Wesley, Oct. 1985, pp. 202–203.

*Primary Examiner*—William M. Treat
*Attorney, Agent, or Firm*—Lawrence J. Bassuk; Richard J. Donaldson

[57] ABSTRACT

An integrated circuit chip comprises a digital signal processor core (12) formed on a portion of the surface area of the chip (10). The digital signal processor (12) has a read only memory (14), a random access memory (16), a register file (18), an arithmetic logic unit (20) and a multiplier circuit (22). The remaining surface area of the integrated circuit chip (10) forms a user-definable circuitry area (24) which is used to form added circuitry to interface the digital signal processor (12) with other components of an integrated data processing system. The circuits formed in the user-definable circuitry area (24) are coupled to other integrated circuit chips through universal input/output bond pads (28). In one embodiment of the present invention, parallel module testing multiplexers (26) are added to aid in the testing of the digital signal processor (12) and the added circuits formed in the user-definable circuitry area (24).

22 Claims, 1 Drawing Sheet

INTEGRATED CIRCUIT HAVING AN EMBEDDED DIGITAL SIGNAL PROCESSOR AND EXTERNALLY TESTABLE SIGNAL PATHS

This is a continuation of application Ser. No. 07/957,754 filed on Oct. 7, 1992 now abandoned which is a continuation application under 37 C.F.R. 1.62 of prior application Ser. No. 07/410,443, filed on Sep. 21, 1989 and now abandoned.

TECHNICAL FIELD OF THE INVENTION

This invention relates in general to the field of electronic devices and more particularly to an integrated circuit having an embedded digital signal processor.

BACKGROUND OF THE INVENTION

A digital signal processing circuit forms the heart of most present day data processing systems. Digital signal processors are extremely complicated circuits which may be formed on a single semiconductor substrate. In order to be integrated into a large data processing system, digital signal processors require a variety of additional peripheral circuits. These circuits can vary widely depending upon the specific application of the processing chip. For example, a digital signal processor may require additional random access memory (RAM), read-only memory (ROM), input/output device drivers or bus interface control circuits.

In prior art systems, these peripheral circuits have been implemented as monolithic devices, or in some cases have been combined onto user definable gate array chips. The placement of these peripheral devices on additional chips degrades the performance of a data processing system because of the interchip communications required. In addition, the increased number of chips means an increase in the overall system size and power requirements.

Some prior art systems have incorporated some limited processing capability on the same chip as a gate array to alleviate some of the interchip communication problems. However, the small scale processing ability of these systems cannot service more complex microcontroller and digital signal processing applications.

Accordingly, a need has arisen for an integrated data processing system which provides complex microcontroller and digital signal processing capability, but eliminates the interchip communication problems associated with multiple chip systems.

SUMMARY OF THE INVENTION

In accordance with the present invention, a monolithic integrated circuit is provided which contains an embedded digital signal processor. The digital signal processor is formed on a portion of a semiconductor substrate. The remainder of the semiconductor substrate is available for additional peripheral circuitry to implement necessary circuitry to allow the digital signal processor to perform complex microcontroller and other applications without the degradation in speed associated with systems requiring interchip communications. The circuitry may be implemented using user definable modules or by filling the remaining semiconductor area with a user definable gate array.

In accordance with another aspect of the present invention, the digital signal processor formed on a portion of a semiconductor substrate includes parallel module testing (PMT) circuits to allow for the testing of signal paths which would not ordinarily be routed to the external input/output pads of the monolithic device. The PMT circuits are implemented such that only a single dedicated test pin is required to test the embedded digital signal processor and any other module or circuits which may have been implemented on the remaining semiconductor surface area.

BRIEF DESCRIPTION OF THE DRAWINGS

A more complete understanding of the present invention may be acquired by referring to the detailed description and claims when considered in connection with the drawings wherein like reference numbers are used to indicate like features and wherein:

DETAILED DESCRIPTION OF THE INVENTION

Figure 1:
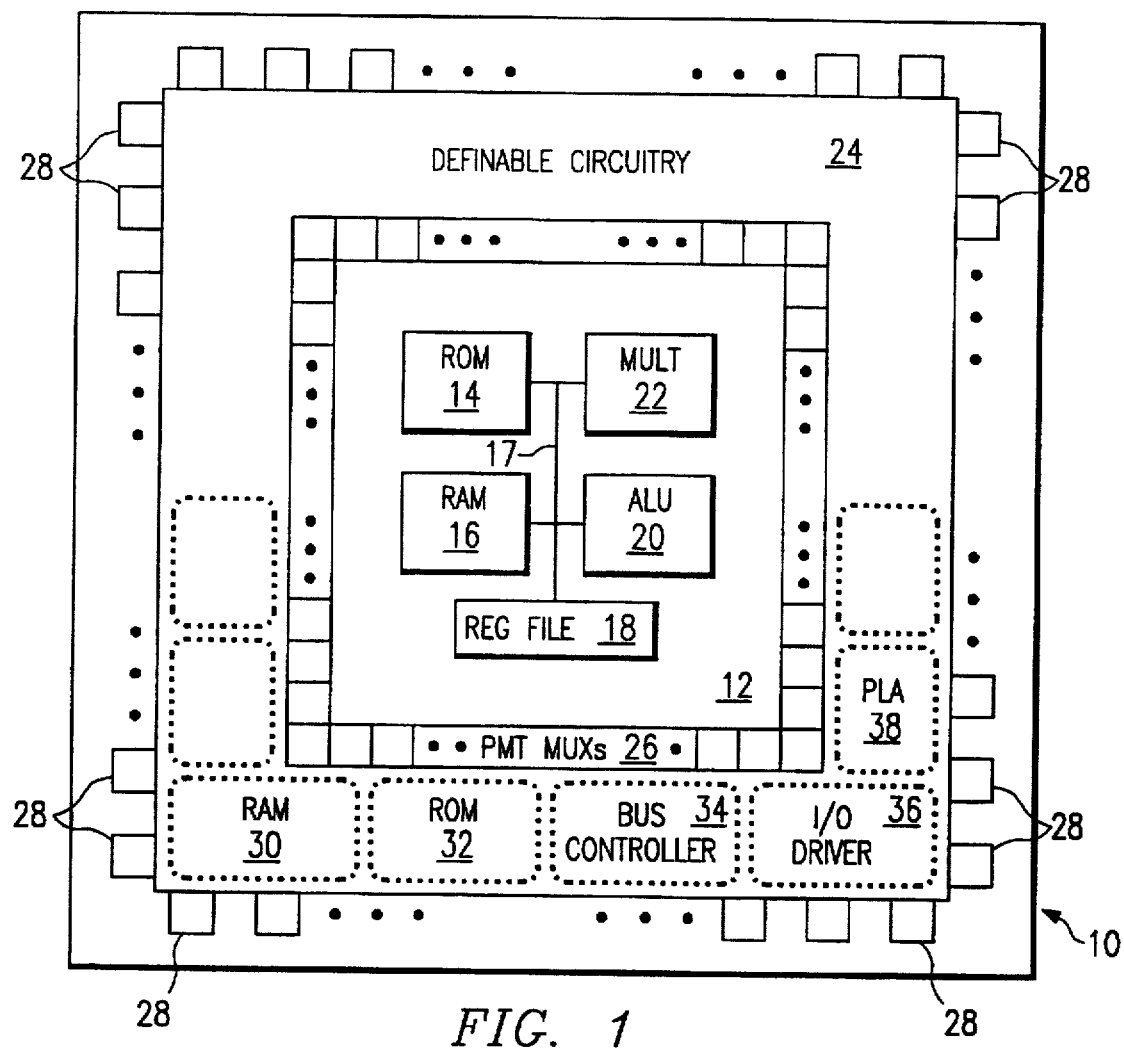
FIG. 1 is a simplified schematic diagram illustrating a monolithic integrated circuit constructed according to the teachings of the present invention.

FIG. 1 is a schematic diagram illustrating an integrated circuit chip 10 constructed according to the teachings of the present invention. Chip 10 comprises a semiconductor substrate on which a variety of circuitry may be formed according to well known semiconductor processing methods. A digital signal processor 12 is formed on a portion of the surface area of chip 10. Processor 12 may comprise a read only memory circuit (ROM) 14 which is operable to permanently store data and microprograms used by digital signal processor 12. A random access memory circuit (RAM) 16 is coupled through a bus 17 to ROM 14. Data may be read from and written to RAM 16 during operations performed by digital signal processor 12. A register file 18 is coupled to ROM 14 and RAM 16 through bus 17 and is used by digital signal processor 12 to communicate with external components of an integrated data processing system.

Digital signal processor 12 further includes an arithmetic logic unit (ALU) 20 coupled to register file 18, RAM 16 and ROM 14 through bus 17. ALU 20 is operable to perform shifting operations, addition operations and subtraction operations on data operated on by digital signal processor 12. Finally, digital signal processor 12 comprises a multiplier circuit 22 coupled to ROM 14, RAM 16, register file 18 and ALU 20 through bus 17. Multiplier circuit 22 is operable to perform multiplication operations on operands used in digital signal processor 12.

According to one embodiment of the present invention, the digital signal processor 12 may comprise, for example, a 160K transistor TMS320C25 digital signal processor designed and manufactured by Texas Instruments Incorporated. The specific architecture and circuits associated with digital signal processor 12 may be constructed on chip 10 according to well known semiconductor processing methods which will therefore not be discussed herein. The 160K transistor TMS320C25 digital signal processor mentioned previously may be constructed using one micron CMOS technology according to known methods to form a digital signal processor core which occupies approximately 55% of the usable semiconductor area of a 9.91 mm×9.93 mm semiconductor chip.

The TMS320C25 digital signal processor is well known in the art to be a powerful application specific digital signal processor. It includes a 32 bit ALU and accumulator circuit as well as a 16×16 bit array multiplier circuit. The TMS320C25 also includes 544 words×16 bit on chip RAM as well as 4096 words×16 bit on chip ROM. The incorporation of the TMS320C25 digital signal processor circuit thereby provides a powerful digital signal processor circuit 12 at the core of the integrated circuit of the present invention.

Referring again to FIG. 1, the remaining usable surface area (approximately 45% of the total area) of chip 10 may be used as a user-definable circuitry area 24. The circuitry occupying user-definable circuitry area 24 interfaces with the digital signal processor 12 through parallel module testing multiplexers (PMT MUXs) 26 shown in FIG. 1.

The circuitry formed on chip 10 communicates with other components of an integrated data processing system through universal input/output (I/O) bond pads 28. Only an exemplary number of universal I/O bond pads 28 are shown in FIG. 1. In an embodiment of the present invention using a TMS320C25 digital signal processing core as digital signal processor 12, there would be 216 universal I/O bond pads 28 surrounding the periphery of the active area of chip 10.

The user-definable circuit area 24 may be occupied by a variety of peripheral circuits definable by a user of the integrated circuit chip 10. FIG. 1 illustrates a number of exemplary modules which might be formed in the user-definable circuitry area 24. For example, the user-definable circuitry area 24 might be used to form an additional RAM circuit 30 or an additional ROM circuit 32. These added memory circuits could be used to augment the memory already present in digital signal processor 12. In addition, the user-definable circuitry area 24 could be used to implement a variety of circuits used to interface the digital signal processor 12 with other components (not shown) of an integrated data processing system. For example, the user-definable circuitry area 24 could be used to form a bus controller circuit 34, an I/O driver circuit 36 or a programmable logic array (PLA) 38. By placing these peripheral control circuits on the same chip 10 as digital signal processor 12, significant time savings in the operation of the integrated device are achieved by eliminating the necessity of slow interchip communications.

The added circuits in user-definable circuitry area 24 illustrated by the exemplary circuits 30 through 38 may be implemented in a variety of ways. For example, the entirety of user-definable circuitry area 24 could be manufactured as a gate array. In the specific embodiment discussed above using a TMS320C25 digital signal processor as digital signal processor 12 on a 9.91 mm×9.93 mm chip, the remaining surface area of chip 10 could be used to implement a gate array having 5K usable gates, assuming 80% of 6.2K total available, with a 0.5 nanosecond typical gate delay.

The digital signal processor 12 is completely fabricated and the user-definable circuitry area 24 is filled with approximately 6.2K gates of which approximately 5K are usable. This process produces a chip die which is capable of being used in a variety of specific applications. Once the choices are made as to the specific application necessary, and the specific added circuitry which is necessary, the fabrication process is completed by forming additional layers of metal and contacts on the surface of the user-definable circuitry area 24 of the chip die to implement the various added circuits necessary for the specific application. The circuit design and semiconductor processing techniques used to implement the various circuits from an existing gate array are well known and will not be discussed herein.

Using the gate array of the aforementioned embodiment, a large number of the added circuits could be implemented in the available surface area. For example, a typical clock generator circuit necessary for the operation of all data processing systems uses only 100 gates. Further, a bus controller such as bus controller 34 typically uses approximately 200 gates. Accordingly, it can be seen that a large number of the necessary circuits which are used in conjunction with a digital signal processor circuit to form an integrated data processing device can be implemented on the same chip with the digital signal processing circuit.

According to a second embodiment of the present invention, the circuits necessary for a specific application are chosen prior to the fabrication of digital signal processor 12. Modular circuit designs are stored in a library of potential circuits. These circuit designs are all compatible with the necessary process techniques used to form the digital signal processing core 12. For a specific application, specific circuits are chosen from this library of potential circuits and these circuits are formed in user-definable circuitry area 24 during the processes used to form digital signal processor 12. The techniques used to form these modular circuits in conjunction with digital signal processor 12 are also well known and will not be described herein.

Prior integrated circuits have incorporated many circuit modules on a single chip. The testing of these circuit modules has presented a problem to circuit designers in the past as some of the signal paths in the integrated device are not coupled to external I/O bond pads. This means that some signal paths ordinarily are not available to be used in testing procedures after the device has been fabricated. In order to solve this problem, integrated system designers have developed the parallel module testing (PMT) system which allows for the testing of all signal paths and requires only a single dedicated test pin for an integrated monolithic device. The parallel module testing system is implemented on the integrated circuit chip of the present invention through the use of PMT MUXs 26 shown in FIG. 1.

Figure 2:
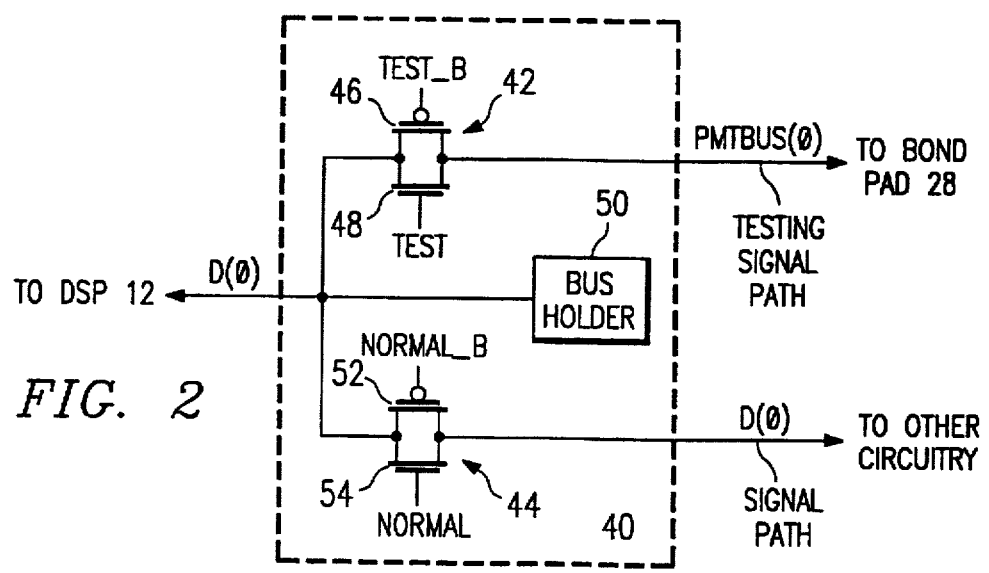
FIG. 2 is a block diagram of a parallel module testing multiplexer circuit used in conjunction with one embodiment of the present invention.

FIG. 2 is a schematic diagram of a single PMT MUX 40 which is used to implement the PMT testing system in integrated circuit chip 10. An exemplary signal D(0) from digital signal processor 12 is shown coupled to PMT MUX 40. This signal is coupled to the inputs of two switching circuits indicated generally at 42 and 44. Switching circuit 42 comprises an N channel field-effect transistor 46 coupled in parallel with a P channel field-effect transistor 48. The signal D(0) is coupled to the source of each of transistors 46 and 48. The gate of transistor 46 is coupled to a TEST_B signal. The gate of the transistor 48 is coupled to a TEST signal. The drain of transistors 46 and 48 output a PMT BUS(0) signal which is routed to one of the universal I/O bond pads 28. A bus holder circuit 50 is coupled to the inputs of switching circuits 42 and 44 and signal D(0) and operates to hold the logical value at these inputs and supply necessary driving current.

Switching circuit 44 comprises an N channel field-effect transistor 52 coupled in parallel to a P channel field-effect transistor 54. Transistors 52 and 54 have their sources coupled to the D(0) signal. The drains of transistors 52 and 54 output a D(0) signal to other circuitry formed in user-definable circuitry area 24. The gate of transistor 52 is coupled to a NORMAL_B signal and the gate of transistor 54 is coupled to a NORMAL signal.

In operation, PMT MUX 40 receives the TEST, TEST_B, NORMAL and NORMAL_B signals and uses the signals to switch the integrated circuit chip 10 between two separate modes of operation. During the testing of chip 10, the switching element 42 couples the D(0) signal from digital signal processor 12 to the PMTBUS(0) signal such that the D(0) signal is selectively accessible on the periphery of the integrated circuit chip 10 through a universal I/O bond pad 28. During normal operation of chip 10, the switching circuit 44 couples the D(0) circuit from digital signal processor 12 to other circuitry formed in the user-definable circuitry area 24 of integrated circuit chip 10. In this manner, a signal path such as the D(0) signal which would ordinarily not be available through an I/O bond pad is made available for testing procedures.

The TEST, TEST_B, NORMAL and NORMAL_B signals required to drive the PMT MUX 40 can all be derived from a single TEST signal and thus only one dedicated pin is required on the periphery of an integrated circuit package used to house chip 10. Thus, through the use of the PMT MUXs 26, the digital signal processor 12 can be tested after fabrication even though many of the signal paths necessary for testing are not routed in normal operation to one of the I/O bond pads 28.

The use of modular circuits in one embodiment of the present invention discussed previously also presents the problem in testing those signal paths which are not ordinarily routed to external I/O bond pads 28. For this reason, according to one embodiment of the present invention, PMT MUXs similar to PMT MUXs 26 are also included for each signal path traveling between modular circuits formed in user-definable circuitry area 24, which are not already routed to an external bond pad or which are not already associated with a PMT MUX 26. In this manner, the entirety of the circuitry formed on integrated circuit chip 10 can be tested notwithstanding the fact that many of the signal paths are not ordinarily routed to one of the 216 external I/O bond pads 28.

While the integrated chip of the present invention has been described in conjunction with two specific embodiments using gate array technology and modular circuit technology to construct added circuitry in the user-definable circuitry area 24, the description of these technologies should not be construed to limit the present invention to the use of any specific circuit or any specific method of constructing these added circuits.

In summary, the integrated circuit chip of the present invention comprises a digital signal processor circuit formed on a portion of a semiconductor substrate. The remaining portion of the semiconductor substrate is used to construct added circuits which are useful in specific applications to interface the digital signal processor core with other components of an integrated data processing system.

Although the present invention has been described in detail, it should be understood that various changes, substitutions and alterations can be made hereto without departing from the spirit and scope of the invention as defined by the appended claims.

What is claimed is:

1. An integrated circuit formed on a surface of a semiconductor substrate comprising:

A. digital signal processor circuitry formed on a portion of the surface of the substrate;
  B. a plurality of added circuits formed on a portion of the remainder of the surface of the substrate, the added circuits being coupled to the digital signal processor circuitry and operating in conjunction with the digital signal processor circuitry and external electronic components coupled to the integrated circuit;
  C. a first signal path coupling the digital signal processor circuitry to at least one of the plurality of added circuits for carrying an operating signal between the digital signal processor circuitry and the at least one added circuit, the first signal path solely coupling circuitry resident on the substrate;
  D. a first testing signal path for testing the digital signal processor circuitry; and
  E. first multiplexing circuitry coupled to the first signal path and to the first testing signal path and responsive to a first test signal for selectively diverting the operating signal from the first signal path to the first testing signal path such that the digital signal processor circuitry may be tested.

2. The circuit of claim 1 in which the digital signal processor circuitry includes:

A. memory circuitry for storing programs and operands used by the digital signal processor;
  B. arithmetic logic circuitry coupled to the memory circuitry and operable to perform arithmetic operations on the operands; and
  C. multiplier circuitry coupled to the memory circuitry and the arithmetic logic circuitry and operable to perform multiplication operations on the operands.

3. The circuit of claim 1 including:

A. a second signal path coupling at least two of the added circuits, the second signal path solely coupling circuitry resident on the substrate and not directly interfacing with the external components;
  B. a second testing signal path for testing the added circuits; and
  C. second multiplexing circuitry coupled to the second signal path and to the second testing signal path and responsive to a second test signal such that the second signal path is accessible through the second testing signal path such that the added circuits may be tested.

4. The circuit of claim 1 in which the integrated circuit occupies less than 100 square millimeters of semiconductor surface area.

5. An integrated circuit formed on a surface of a semiconductor substrate comprising:

A. digital signal processor circuitry formed on a portion of the surface of the substrate;
  B. gate array circuitry formed on a portion of the remainder of the surface of the substrate, the gate array circuitry being programmable by further processing to operate in conjunction with the digital signal processor circuitry and external electronic components coupled to the integrated circuit;
  C. a first signal path coupling the digital signal processor circuitry to the gate array circuitry for carrying an operating signal between the digital signal processor circuitry and the gate array circuitry, the first signal path solely coupling circuitry resident on the substrate;
  D. a first testing signal path for testing the digital signal processor circuitry; and
  E. first multiplexing circuitry coupled to the first signal path and to the first testing signal path and responsive to a first test signal for selectively diverting the operating signal from the first signal path to the first testing signal path such that the digital signal processor circuitry may be tested.

6. The circuit of claim 5 in which the digital signal processor circuitry includes:

A. memory circuitry for storing programs and operands used by the digital signal processor circuitry;

B. arithmetic logic circuitry coupled to the memory circuitry and operable to perform arithmetic operations on the operands; and C. multiplier circuitry coupled to the memory circuitry and the arithmetic logic circuitry and operable to perform multiplication operations on the operands.

7. The circuit of claim 5 in which the integrated circuit occupies less than 100 square millimeters of semiconductor surface area.

8. An integrated circuit formed on a surface of a semiconductor substrate comprising:

A. digital signal processor circuitry formed on the surface of the substrate, the digital signal processor circuitry including:
    i. memory circuitry for storing programs and operands used by the digital signal processor circuitry;
    ii. arithmetic logic circuitry coupled to the memory circuitry and operable to perform arithmetic operations on the operands; and
    iii. multiplier circuitry coupled to the memory circuitry and the arithmetic logic circuitry for performing multiplication operations on the operands;

B. a plurality of bond pads formed on the surface of the substrate;

C. gate array circuitry formed on the surface of the substrate, the gate array circuitry being programmable to be coupled to the digital signal processor circuitry and the bond pads to operate in conjunction with the digital signal processor circuitry and external electronic components coupled to the integrated circuit through the bond pads;

D. at least one signal path coupling the digital signal processor circuitry to the gate array circuitry for carrying an operating signal between the digital signal processor circuitry and the gate array circuitry, the signal path not directly coupled to any of the bond pads;

E. a testing signal path for testing the digital signal processor circuitry; and F. multiplexing circuitry coupled to the signal path and responsive to a test signal for selectively diverting the operating signal from the signal path to the testing signal path, the testing signal path coupling the multiplexing circuitry to at least one of the bond pads such that the operating signal is selectively accessible through the bond pads.

9. The circuit of claim 8 in which the integrated circuit occupies less than 100 square millimeters of semiconductor surface area.

10. The circuit of claim 8 in which the digital signal processor circuitry occupies no more than 55 percent of the surface area of the substrate surface.

11. The circuit of claim 8 in which the gate array occupies at least 45 percent of the surface area of the substrate surface.

12. A method for constructing an integrated circuit on a surface of a semiconductor substrate comprising:

A. forming digital signal processor circuitry on a portion of the surface of the substrate;

B. forming a plurality of transistors in gate array circuitry on another portion of the surface of the substrate that are programmable by further processing;

C. forming interconnects between selected ones of the plurality of transistors and the digital signal processor circuitry to form circuitry operating in conjunction with the digital signal processor circuitry and external electronic components coupled to the integrated circuit, at least one of the interconnects not directly coupled to any of the external electronic components;

D. forming a test signal path for testing the digital signal processor circuitry; and E. forming multiplexing circuitry coupled to the at least one of the interconnects and responsive to a test signal for diverting an operating signal from the at least one of the interconnects to the teat signal path, the test signal path coupled to the multiplexing circuitry such that the digital signal processor circuitry may be tested.

13. The process of claim 12 including forming the integrated circuit to occupy less than 100 square millimeters of semiconductor surface area.

14. An integrated circuit formed on a surface of a semiconductor substrate comprising:

A. digital signal processor circuitry formed on a portion of the surface of the substrate;

B. a plurality of added circuits formed on a portion of the remainder of the surface of the substrate, the added circuits being coupled to the digital signal processor circuitry and operating in conjunction with the digital signal processor circuitry and external electronic components coupled to the integrated circuit;

C. a signal path coupling the digital signal processor circuitry to one of the added circuits for carrying an operating signal between the digital signal processor circuitry and the one added circuit, the signal path solely coupling circuitry resident on the substrate;

D. a testing signal path for testing the digital signal processor circuitry; and E. multiplexing circuitry coupled to the signal path and responsive to a test signal for selectively breaking the signal path and simultaneously diverting the operating signal to the testing signal path.

15. The integrated circuit of claim 14 including a plurality of bond pads formed on the surface of the substrate, the multiplexing circuitry including first switching circuitry connected between a pair of nodes on the testing signal path, one of the nodes being directly connected to one of the bond pads.

16. The integrated circuit of claim 15 including control circuitry for controlling operation of the multiplexing circuitry, the control circuitry being connected to and driven from another of the bond pads that receives the test signal, the another bond pad being the only bond pad from which the control circuitry is driven.

17. The integrated circuit of claim 16 in which the multiplexing circuitry includes second switching circuitry connected in the signal path between the digital signal processor circuitry and the one added circuitry.

18. The integrated circuit of claim 17 in which each of the switching circuits is a transmission gate.

19. The integrated circuit of claim 18 in which each transmission gate includes a pair of FETs coupled in parallel with one another, the control circuitry being connected to respective gates of the FETs.

20. The integrated circuit of claim 14 including a plurality of bond pads formed on the surface of the substrate and control circuitry for controlling operation of the multiplexing circuitry, the control circuitry being connected to and driven from one of the bond pads that receives the test signal, the one bond pad being the only bond pad from which the control circuitry is driven.

21. An integrated circuit formed on a surface of a semiconductor substrate comprising:

A. a first circuit module formed on a portion of the surface of the substrate and including digital signal processor circuitry;

B. a plurality of added circuit modules formed on a portion of the remainder of the surface of the substrate, the added circuit modules being coupled to the digital signal processor circuitry and operating in conjunction with the digital signal processor circuitry and external electronic components coupled to the integrated circuit;

C. a signal path coupling the digital signal processor circuitry to one of the added circuit modules for carrying an operating signal between the digital signal processor circuitry and the one added circuit module, the signal path solely coupling circuitry resident on the substrate;

D. a testing signal path for testing the digital signal processor circuitry; and E. the first circuit module including multiplexing circuitry coupled to the signal path and responsive to a test signal for selectively diverting the operating signal from the signal path to the testing signal path.

22. The integrated circuit of claim 21 including an additional signal path coupling two of the added circuit modules for carrying an operating signal therebetween, the additional signal path solely coupling circuitry resident on the substrate and not directly interfacing with the external components, an additional testing signal path for testing one of the two added circuit modules, and additional multiplexing circuitry coupled to the addition signal path and responsive to a test signal for selectively diverting the operating signal from the additional signal path to the additional testing signal path.

* * * * *